(12) United States Patent
Inn et al.

(10) Patent No.: US 6,275,395 B1
(45) Date of Patent: Aug. 14, 2001

(54) ACCELERATED TURN-OFF OF MOS TRANSISTORS BY BOOTSTRAPPING

(75) Inventors: Bruce Lee Inn, San Jose; Alland Chee, Union City, both of CA (US)

(73) Assignee: Micrel, Incorporated, San Jose, CA (US)

( * ) Notice: Subject to any disclaimer, the term of this patent is extended or adjusted under 35 U.S.C. 154(b) by 0 days.

(21) Appl. No.: 09/745,401

(22) Filed: Dec. 21, 2000

(51) Int. Cl.[7] ................................................... H02M 3/07
(52) U.S. Cl. ............................................................. 363/60
(58) Field of Search ........................ 363/59, 60; 307/108, 307/109, 110; 327/536; 323/908

(56) References Cited

U.S. PATENT DOCUMENTS

| | | | |
|---|---|---|---|
| 4,454,571 | * 6/1984 | Miyashita | 363/60 |
| 4,803,612 | 2/1989 | Skovmand | 323/284 |
| 5,029,063 | 7/1991 | Lingstaedt et al. | 363/60 |
| 5,606,491 | 2/1997 | Ellis | 363/60 |
| 5,635,776 | 6/1997 | Imi | 307/110 |
| 5,670,869 | * 9/1997 | Weisenbach | 323/313 |
| 6,188,210 | * 2/2001 | Tichauer et al. | 323/273 |
| 6,215,348 | * 4/2001 | Steensgaard-Madsen | 327/390 |

* cited by examiner

Primary Examiner—Adolf Deneke Berhane
(74) Attorney, Agent, or Firm—Skjerven Morrill MacPherson LLP; Brian D. Ogonowsky

(57) ABSTRACT

A controller for limiting the current through a pass transistor is described herein that includes an NMOS control transistor coupled between the gate of the pass transistor and ground. The gate of the NMOS control transistor is coupled to a bootstrap circuit via a PMOS transistor. The PMOS transistor is turned on in the event of a current limit signal to momentarily apply the bootstrap voltage to the gate of the NMOS control transistor. This quickly turns on the NMOS control transistor to discharge the gate of the pass transistor, shutting off the pass transistor and terminating the high current situation. After the bootstrapped voltage has been shunted to ground, a reverse biased diode allows the gate of the NMOS control transistor to remain charged to keep the NMOS control transistor on. After the current limit situation has passed, the NMOS control transistor is switched off. Accordingly, short circuits in the load are quickly uncoupled from the remainder of the system by the fast reaction time of the NMOS control transistor.

19 Claims, 3 Drawing Sheets

ACCELERATED TURN-OFF OF MOS TRANSISTORS BY BOOTSTRAPPING

FIELD OF THE INVENTION

This invention relates to a technique for controlling an MOS pass transistor in a power controller and, in particular, for more quickly turning off the pass transistor in the event of a high current through the transistor, such as in the event of a short circuit.

BACKGROUND

FIG. 1 illustrates a typical power controller 10 that provides soft-startup and short-circuit protection for any load. The controller 10 receives an on/off control signal and, in response, turns pass transistor 12 on or off to couple the input voltage Vin at input terminal 14 to a load 16. The load may be a low-voltage electronic system.

The pass transistor 12 is an NMOS transistor whose gate voltage must be significantly above its source voltage in order to fully turn on. Since, ideally, the voltage applied to load 16 is approximately the same voltage as Vin, the gate voltage must be significantly higher than the input voltage Vin. Accordingly, a charge pump 18 is used to double or triple the input voltage, and the multiplied voltage is coupled to the gate of the pass transistor 12 in response to the on/off signal applied to terminal 20. Capacitively switched voltage doublers and voltage triplers are well known and need not be described. A gate filter capacitor 21 is commonly used to filter the signal from the charge pump 18.

The circuitry described above is commonly used to selectively apply power to various loads in a system, where a number of the circuits of FIG. 1 are connected to the same power supply. When the pass transistor 12 is turned on for a capacitive load (the load may include a large filter capacitor), there will be a large inrush current through the pass transistor 12. This inrush current is not only dangerous for the pass transistor 12 but it will momentarily lower Vin, causing a brown-out of other systems powered from the same supply line. To limit the current through the pass transistor 12, a current limiting circuit is employed. This current limiting circuit typically includes a low value current sense resistor R1, where the voltage across the resistor R1 is proportional to the current through the pass transistor 12. This voltage is applied to a differential amplifier 22 to obtain a voltage proportional to the current. The output of amplifier 22 is applied to an input of a second differential amplifier 24. The differential amplifier 24 has another of its inputs connected to a reference voltage that is set to a current threshold limit.

As the current through sense resistor R1 reaches the current limit, the output of differential amplifier 24 controls an NMOS transistor 26 to shunt current from the gate of the pass transistor 12 so as to limit the current through pass transistor 12 to at or below the threshold current. The input voltage Vin powers the differential amplifier 24 so that the maximum gate voltage to the NMOS transistor 26 is Vin.

The current limiting circuitry in FIG. 1 is also referred to as a hot-swap controller, since it allows the load 16 to be replaced with another load while avoiding the current surging that could cause a brown-out of other systems connected to the same supply voltage Vin.

In the event of a short circuit in load 16, it is desirable that the NMOS transistor 26 be quickly turned on to shut off pass transistor 12. The load may be low voltage electronic circuitry that can operate with voltages as low as 2 volts. With a low input voltage Vin, the turn on time of the NMOS transistor 26 is relatively high and the discharging capability of transistor 26 is relatively limited, delaying the turn off of the pass transistor 12. One solution for speeding up the turn-on time of the NMOS transistor 26 is to use a very large NMOS transistor 26. Another solution is to substitute transistor 26 with a bipolar transistor. Using a large NMOS transistor 26 undesirably uses up die area, and forming a bipolar transistor complicates the manufacturing process.

What is needed is a technique for quickly turning on NMOS transistor 26 that does not suffer the drawbacks described above.

SUMMARY

A controller for limiting the current through a pass transistor is described herein that includes an NMOS control transistor coupled between the gate of the pass transistor and ground. The gate of the pass transistor is coupled to a bootstrap circuit, such as a charge pump, that provides a higher voltage than the input supply voltage. The bootstrap circuit is controlled to selectively turn on and off the pass transistor to provide power to a load.

The gate of the NMOS control transistor is coupled to the bootstrap circuit via a PMOS transistor. The PMOS transistor is turned on in the event of a current limit signal to momentarily apply the bootstrap voltage to the gate of the NMOS control transistor. This quickly turns on the NMOS control transistor to discharge the gate of the pass transistor, shutting off the pass transistor and terminating the high current situation.

After the bootstrapped voltage has been shunted to ground, a reverse biased diode allows the gate of the NMOS control transistor to remain charged to keep the NMOS control transistor on. After the current limit situation has passed, the NMOS control transistor is switched off.

Accordingly, short circuits in the load are quickly uncoupled from the remainder of the system by the fast reaction time of the NMOS control transistor.

DETAILED DESCRIPTION OF THE EMBODIMENTS

Figure 1:
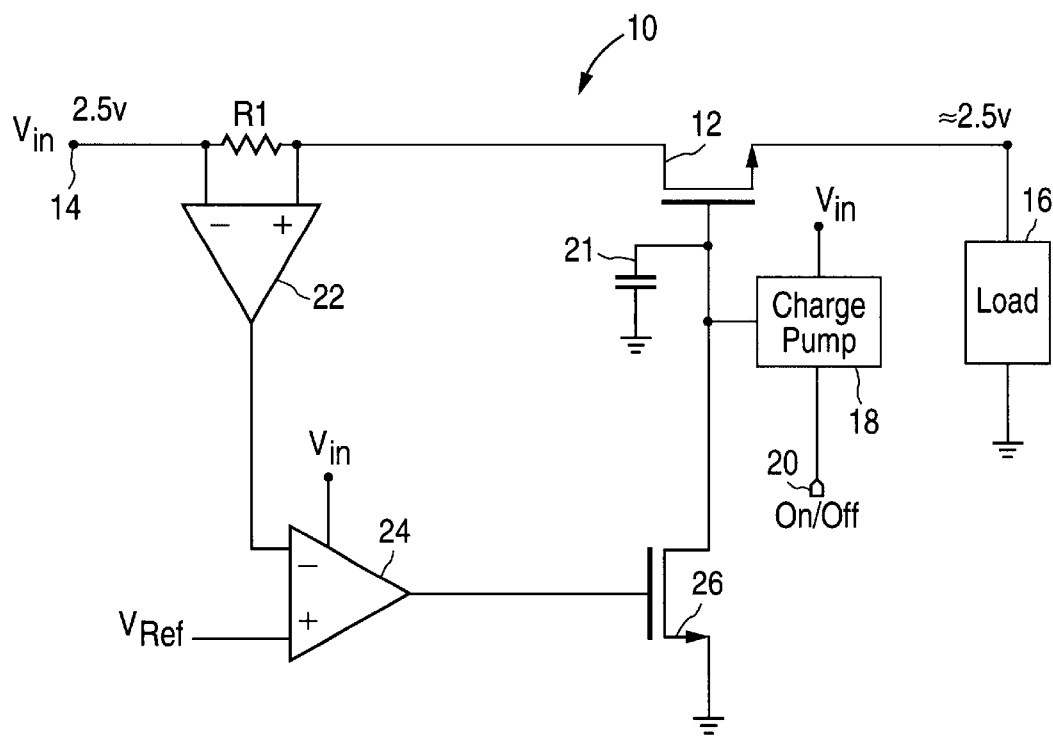
FIG. 1 illustrates a prior art power control circuit incorporating a hot-swap controller.
Figure 2:
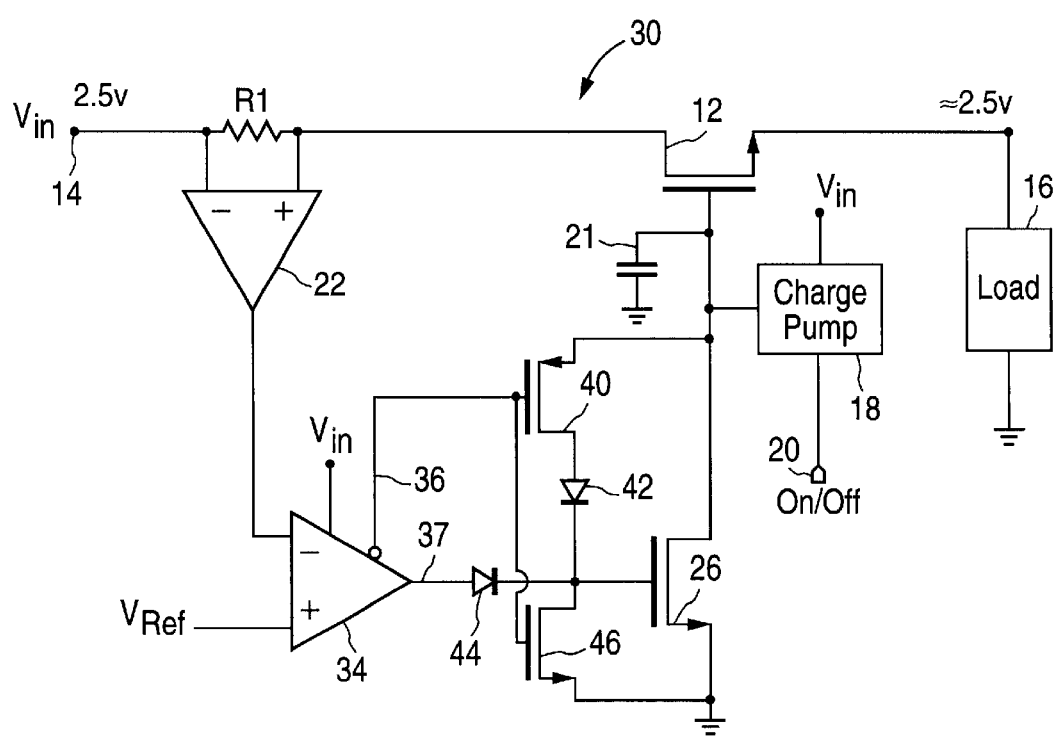
FIG. 2 illustrates the improvement to the circuit of FIG. 1 by using bootstrapping to quickly turn on an NMOS control transistor to discharge the gate of a pass transistor in the event of a short circuit.

FIG. 2 illustrates a power controller 30 incorporating one embodiment of the present invention. Elements having the same numerals as in FIG. 1 perform the same function and may be identical. In the circuit of FIG. 2, the NMOS transistor 26 that is used to shut down pass transistor 12 to limit the current through pass transistor 12 initially receives a high gate voltage from the charge pump 18 to quickly shut down the pass transistor 12 in the event of a short circuit in the load 16.

The current through pass transistor 12 corresponds to the output of the differential amplifier 22, as previously discussed. This signal is applied to a differential amplifier 34, having applied to its other input terminal a reference voltage V Ref that sets the current limit for the hot-swap controller. The differential amplifier 34 provides an inverted output 36 and a non-inverted output 37. Such differential amplifiers are conventional.

An on signal applied to charge pump 18 via terminal 20 turns on pass transistor 12, and current flows through transistor 12. An on signal may turn on the charge pump by starting its oscillator, or the on signal may simply control a switch to connect the charge pump voltage to the gate of the pass transistor 12. An off signal disables the charge pump and pulls the gate of the pass transistor 12 to ground.

In one embodiment, charge pump 18 is a voltage doubler or voltage tripler implemented by controlling switches with various clock phases to connect capacitors in certain combinations, as is well known. Examples of charge pumps are found in U.S. Pat. Nos. 5,029,063; 5,606,491; 5,635,776; and 4,803,612. The Micrel low dropout regulator MIC5157 also includes a suitable charge pump. The MIC5157 and the cited patents are incorporated herein by reference. The charge pump can be any circuit that boosts an input voltage, including any boost voltage regulator.

In the event of a short circuit in load 16, the current through sense resistor R1 will be high, causing the output of differential amplifier 22 to be below the threshold set by reference voltage V Ref. This causes the inverted output 36 to be low (e.g., ground) and the non-inverted output 37 to be high (e.g., Vin).

Using the prior art circuit of FIG. 1, if Vin is relatively low (e.g., under 3 volts), the reaction time of NMOS transistor 26 will be slow and the transistor's ability to discharge the gate filter capacitance will be unacceptably limited. As a result, the short circuit in load 16 will cause brown-outs to other systems coupled to Vin and possibly destroy transistor 12. To increase the drain current of transistor 25, the following circuitry is employed. A PMOS transistor 40 has its source connected to the output of the charge pump 18 so as to receive the doubled or tripled supply voltage Vin. The doubled or tripled voltage output from the charge pump 18 is also referred to a bootstrap voltage. The gate of the PMOS transistor 40 is coupled to the inverted output 36 of the differential amplifier 34 so that PMOS transistor 40 fully turns on during the high current situation.

The bootstrap voltage passed by PMOS transistor 40 is applied to a diode 42 to forward bias diode 42, and the resulting voltage is applied to the gate of NMOS transistor 26 to quickly place transistor 26 into a fully on state. This quickly discharges the gate of pass transistor 12 to decouple load 16 from the power supply.

The non-inverted output 37 of the differential amplifier 34 applies the supply input voltage Vin to diode 44. Diode 44 is in a blocking state since the voltage at its cathode after the PMOS transistor 40 turns on is at approximately the bootstrap voltage minus the voltage dropped across diode 42. Diodes 42 and 44 are preferably Schottky diodes.

As NMOS transistor 26 turns on, it pulls down the bootstrap voltage applied to the pass transistor 12 and PMOS transistor 40. Diodes 42 and 44 will then both be in their blocking states since the gate of the NMOS transistor 26 has been charge to the bootstrap voltage minus a diode drop by the initial turn on of PMOS transistor 40. Eventually, due to gate leakage, the gate voltage of NMOS transistor 26 will fall to Vin minus the diode 44 voltage drop, at which time diode 44 will become forward biased. NMOS transistor 26 will then be maintained in an on state by the forward conductance of diode 44.

A pull down transistor 46 may be coupled to the gate of NMOS transistor 26 to turn NMOS transistor 26 off after the high current condition has ended. The pull down transistor 46 would be turned on by a signal from the inverted output 36 of differential amplifier 34.

Figure 3:
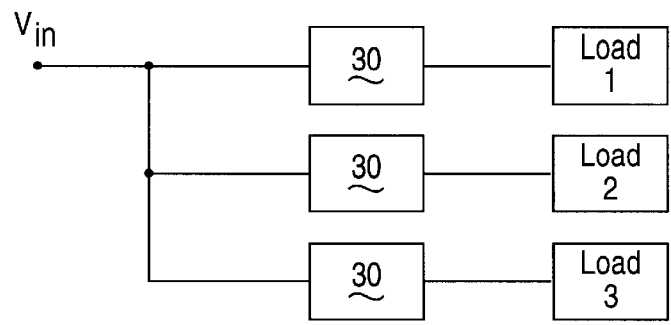
FIG. 3 illustrates the multiple versions of the circuit in FIG. 2 used in a system with hot-swap capability.

FIG. 3 illustrates three circuits 30 being connected to the same supply line but to different loads. If any of the loads develops a short circuit or is replaced, the current limiting feature of the invention prevents brown-outs of the remaining loads.

Figure 4:
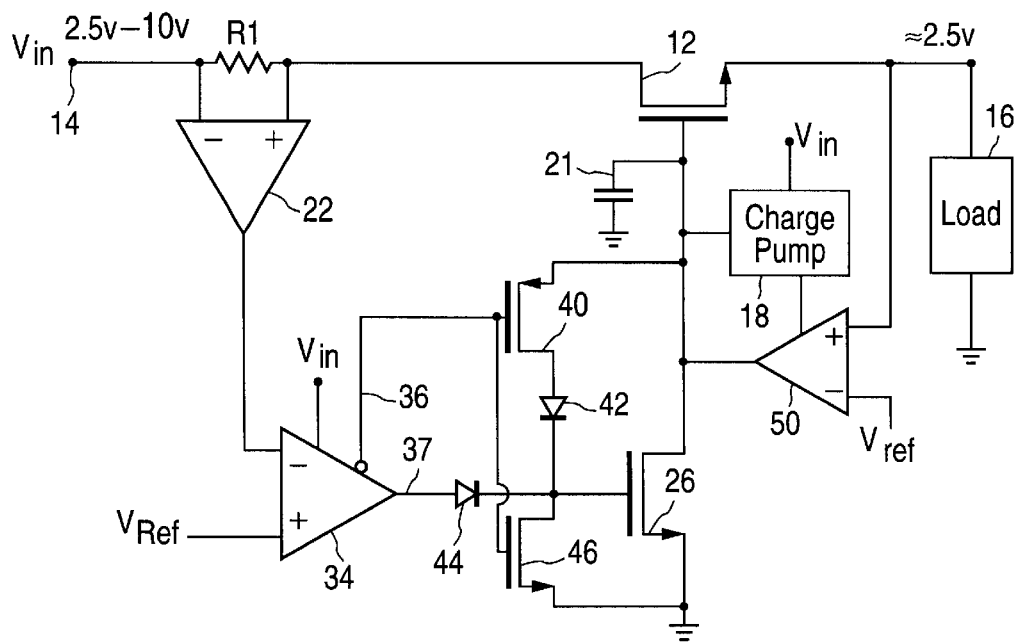
FIG. 4 illustrates a low dropout (linear) regulator using current limit circuitry in accordance with the present invention.

This invention may also be applied to any other type of circuit that requires rapid pull down of a pass transistor's gate by a separate turn off transistor. In another embodiment, the circuitry is applied to a low drop out regulator shown in FIG. 4, which is identical to FIG. 2 except a feedback loop including an error amplifier 50 controls the charge pump 18 to provide a gate voltage to pass transistor 12 necessary to maintain the output at a predetermined regulated voltage. In the event of a short circuit in load 16, the NMOS transistor 26 quickly turns off the pass transistor 12. Low drop out regulators are well known. The feedback may be a divided output voltage that is controlled to approximately equal the reference voltage applied to the error amplifier 50.

Figure 5:
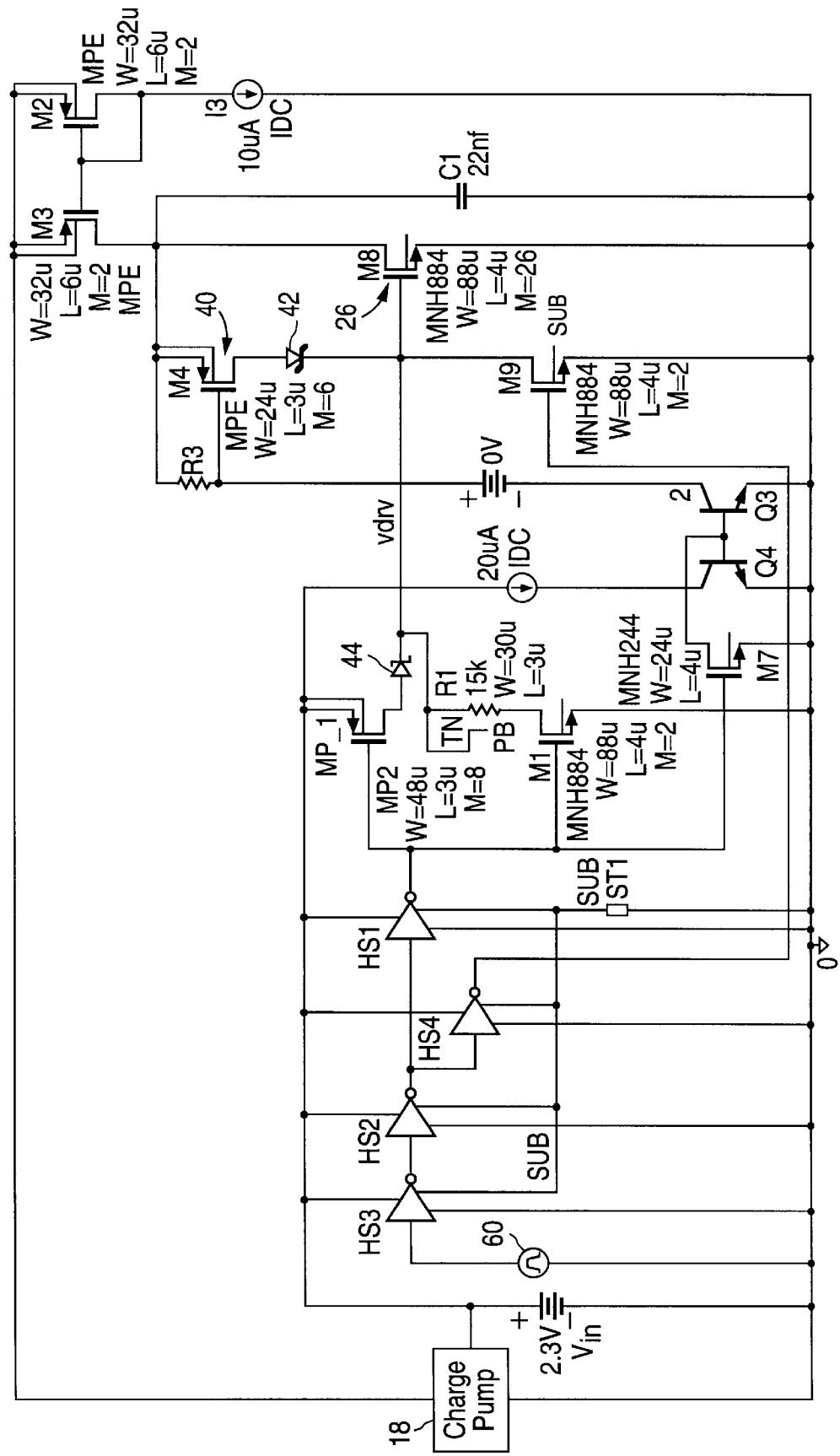
FIG. 5 is a detailed schematic diagram of pertinent portions of a hot-swap controller.

FIG. 5 is a detailed schematic diagram of another implementation of the circuitry used to quickly turn off the NMOS transistor 26 using a bootstrap voltage. The circuit of FIG. 5 was used to simulate the operation of the inventive technique and does not fully illustrate the differential amplifier 34. The signal provided by signal source 60 indicates a high current condition requiring the rapid shutdown of the NMOS transistor 26. The supply voltage Vin is shown, along with charge pump 18, which may be a voltage doubler or tripler. The capacitive gate of the pass transistor 12 is modeled by a capacitor C1. A current mirror formed by transistors M2 and M3 apply the bootstrap voltage from the charge pump 18 to the PMOS transistor 40 at a current of 10 microamperes.

The over-current control signal provided by signal source 60 is applied to inverter HS1 via the serial connection of inverters HS2 and HS3. The output of HS1 is applied to the inverter comprising transistors MP_1 and M1, such that transistor MP_1 is turned on during the over-current situation.

The output of inverter HS1 is also applied to transistor M7 for controlling a current mirror formed by transistor Q3 and Q4. Although these transistors are shown as bipolar transistors, they may also be MOS transistors. When there is an over-current condition, transistor M7 is turned off, causing transistor Q3 to turn-on and pull the gate of the PMOS transistor 40 low. The turning on of the PMOS transistor 40 couples the bootstrap voltage, through diode 42, to the gate of the NMOS transistor 26 to quickly turn on transistor 26 and discharge capacitor C1 (modeling the pass transistor gate). After the bootstrap voltage has been sufficiently pulled down by the turn-on of NMOS transistor 26, diode 42 will become reverse biased. The gate voltage necessary to keep NMOS control transistor 26 on will ultimately be maintained by the on state of transistor MP_1, providing voltage to the gate via diode 44.

When the over-current situation no longer exists, the signal source 60 will provide a low signal, which turns off transistor MP_1 and PMOS transistor 40, and turns on transistors M9 and M1 to discharge the gate of NMOS transistor 26 to turn off transistor 26.

Simulations have shown that the discharge of the gate capacitance C1 is accelerated by more than four-to-one as compared to the prior art circuits. The additional circuitry shown in FIG. 2 (and the corresponding circuitry in FIG. 5) requires very little area as compared to the alternative structures described in the background section of this disclosure.

The invention may be applied to any form of power controller, including hot-swap controllers, low drop-out regulators, or any other controller for providing power to a load while also requiring over-current protection. All circuitry may be formed on a single chip.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A circuit comprising:
   a first terminal for receiving a supply voltage;
   an NMOS pass transistor having a gate, said pass transistor coupled between said first terminal and a second terminal;
   a charge pump coupled to said gate of said pass transistor for providing an enhanced voltage, derived from said supply voltage, greater than said supply voltage;
   an NMOS control transistor coupled to said gate of said pass transistor for discharging the gate of said pass transistor when said NMOS control transistor is turned on;
   a PMOS transistor coupled to receive said enhanced voltage and being coupled to said gate of said NMOS control transistor, said PMOS transistor having a gate;
   a current detector providing a current threshold signal; and
   a controller coupled to said gate of said PMOS transistor and to a gate of said NMOS control transistor, said controller turning on said PMOS transistor to charge said gate of said NMOS transistor to approximately said enhanced voltage to turn on said NMOS control transistor in response to said current threshold signal.

2. The circuit of claim 1 wherein said charge pump is a voltage doubler.

3. The circuit of claim 1 wherein said charge pump is a voltage tripler.

4. The circuit of claim 1 wherein said PMOS transistor and said NMOS control transistor form part of a hot-swap controller, said hot-swap controller limiting current through said pass transistor when a load is connected to said second terminal of said NMOS pass transistor.

5. The circuit of claim 1 further comprising a discharge transistor coupled to said gate of said NMOS control transistor for turning off said NMOS control transistor when said current threshold signal is removed.

6. The circuit of claim 1 wherein said current detector provides a variable current detection signal to limit a current through said pass transistor.

7. The circuit of claim 1 where in said current detector comprises:
   a current sense resistor in series between said first terminal and said NMOS pass transistor; and
   a current sensor for detecting a voltage across said current sense resistor and providing a signal indicative of the current through the sense resistor.

8. The circuit of claim 1 wherein said charge pump includes a control terminal coupled to a control signal for turning on and off said pass transistor.

9. The circuit of claim 1 further comprising:
   a first diode connected between said PMOS transistor and said gate of said NMOS control transistor; and
   a second diode connected between said controller and said gate of said NMOS control transistor.

10. The circuit of claim 1 wherein said controller comprises a differential amplifier that compares a current through said pass transistor to a threshold to generate said current threshold signal.

11. The circuit of claim 1 further comprising a feedback circuit for detecting output voltage at said second terminal and controlling said charge pump to supply a gate voltage to said pass transistor to provide a predetermined output voltage.

12. A method performed by a circuit for turning off a pass transistor connected between an input supply and a load, said circuit comprising a first terminal for receiving a supply voltage; an NMOS pass transistor having a gate, said pass transistor coupled between said first terminal and a second terminal; a charge pump coupled to said gate of said pass transistor for providing an enhanced voltage, derived from said supply voltage, greater than said supply voltage; and an NMOS control transistor coupled to said gate of said pass transistor for discharging the gate of said pass transistor when said NMOS control transistor is turned on, said method comprising:
   applying said enhanced voltage to a first terminal of PMOS transistor, a second terminal of said PMOS transistor being coupled to said gate of said NMOS control transistor, said PMOS transistor having a gate;
   generating a current detection signal relating to a current through said pass transistor; and
   turning on said PMOS transistor to charge said gate of said NMOS transistor to approximately said enhanced voltage to turn on said NMOS control transistor in response to said current detection signal.

13. The method of claim 12 further comprising turning on a discharge transistor coupled to said gate of said NMOS control transistor for turning off said NMOS control transistor in response to said current detection signal.

14. The method of claim 12 wherein said current detection signal provides a variable signal to limit a current through said pass transistor.

15. The method of claim 12 wherein said current detection signal is a current threshold signal that indicates that the current through said pass transistor has exceeded a certain limit.

16. The method of claim 12 further comprising generating a control signal for turning on and off said pass transistor.

17. The method of claim 12 further comprising:
   blocking current between said PMOS transistor and said gate of said NMOS control transistor with a first diode after said gate of said NMOS control transistor has been substantially charged to said enhanced voltage; and
   blocking current between a steady state signal generator and said gate of said NMOS control transistor with a second diode until said gate of said NMOS control transistor has decayed below a signal output by said steady state signal generator, so as to maintain said NMOS control transistor on.

18. The method of claim 12 further comprising comparing a current through said pass transistor to a threshold to generate said current detection signal.

19. The method of claim 12 further comprising generating a feedback signal corresponding to an output voltage at said second terminal and controlling a charge pump to supply a gate voltage to said pass transistor to provide a predetermined output voltage.

* * * * *